US008261118B2

(12) United States Patent
Calo et al.

(10) Patent No.: US 8,261,118 B2
(45) Date of Patent: Sep. 4, 2012

(54) ENERGY-EFFICIENT SERVER LOCATION DETERMINATION

(75) Inventors: Seraphin B. Calo, Cortlandt Manor, NY (US); David L. Kaminsky, Chapel Hill, NC (US); Dinesh C. Verma, New Castle, NY (US); Xiping Wang, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 363 days.

(21) Appl. No.: 12/567,603

(22) Filed: Sep. 25, 2009

(65) Prior Publication Data
US 2011/0078480 A1 Mar. 31, 2011

(51) Int. Cl.
G06F 1/00 (2006.01)
G06F 11/30 (2006.01)
(52) U.S. Cl. ............ 713/340; 713/320; 702/60; 702/61; 702/62; 702/130; 702/132; 709/224
(58) Field of Classification Search .................. 713/320, 713/340; 702/60, 61, 62, 130, 132; 709/224
See application file for complete search history.

(56) References Cited

U.S. PATENT DOCUMENTS

| 6,795,928 | B2 |   | 9/2004 | Bradley et al. | |
|---|---|---|---|---|---|
| 6,847,854 | B2 |   | 1/2005 | Discenzo | |
| 7,500,001 | B2 |   | 3/2009 | Tameshige et al. | |
| 7,596,431 | B1 |   | 9/2009 | Forman et al. | |
| 7,596,476 | B2 | * | 9/2009 | Rasmussen et al. | 703/2 |
| 7,620,613 | B1 |   | 11/2009 | Moore et al. | |
| 7,644,148 | B2 |   | 1/2010 | Ranganathan et al. | |
| 7,726,144 | B2 | * | 6/2010 | Larson et al. | 62/259.2 |
| 7,857,214 | B2 | * | 12/2010 | Saliaris | 235/383 |
| 8,053,926 | B2 | * | 11/2011 | Lehmann et al. | 307/64 |
| 2007/0089446 | A1 | * | 4/2007 | Larson et al. | 62/259.2 |
| 2007/0174024 | A1 | * | 7/2007 | Rasmussen et al. | 703/1 |
| 2008/0046766 | A1 | * | 2/2008 | Chieu et al. | 713/300 |
| 2008/0265722 | A1 | * | 10/2008 | Saliaris | 312/223.1 |
| 2009/0276095 | A1 | * | 11/2009 | Pienta et al. | 700/277 |
| 2009/0276528 | A1 | * | 11/2009 | Pienta et al. | 709/226 |
| 2009/0282140 | A1 | * | 11/2009 | White et al. | 709/223 |
| 2009/0309570 | A1 | * | 12/2009 | Lehmann et al. | 323/318 |
| 2010/0211810 | A1 |   | 8/2010 | Zacho | |
| 2010/0214940 | A1 | * | 8/2010 | Macauley | 370/252 |

OTHER PUBLICATIONS

Monem H. Beitelmal, Chandrakant D. Patel, Model-Based Approach for Optimizing a Data Center Centralized Cooling System, Article, Apr. 14, 2006, pp. i, 1-20, Hewlett-Packard Development Company, L.P., Palo Alto, CA, USA.
Ernesto Ferrer, Christian Bonilla, Cullen Bash, Marcos Batista, Data Center Thermal Zone Mapping: An Innovative Visualization Tool for Thermal Metric Analysis, Article, Sep. 2007, pp. 1-10, Hewlett-Packard Development Company, L.P., USA.

(Continued)

Primary Examiner — Thomas Lee
Assistant Examiner — Jaweed A Abbaszadeh
(74) Attorney, Agent, or Firm — Lee Law, PLLC; Christopher B. Lee

(57) ABSTRACT

A heat potential value for each of a set of available server locations is calculated via a data center controller based upon at least one active server in a data center. A minimal calculated heat potential value for the set of available server locations is identified. An available server location associated with the identified minimal calculated heat potential value is selected from the set of available server locations.

17 Claims, 5 Drawing Sheets

OTHER PUBLICATIONS

R. R. Schmidt, E. E. Cruz, M. K. Iyengar, Challenges of Data Center Thermal Management, Journal, Jul./ Sep. 2005, pp. 709-723, vol. 49 No. 4/5, International Business Machines Corporation, IBM Journal of Research and Development, published on the World Wide Web.

United States Patent and Trademark Office, Office Action for U.S. Appl. No. 12/567,549, Mar. 2, 2011, pp. 1-17, Alexandria, VA, USA.

United States Patent and Trademark Office, Notice of Allowance for U.S. Appl. No. 12/567,549, Aug. 23, 2011, pp. 1-5, Alexandria, VA, USA.

United States Patent and Trademark Office, Notice of Allowance for U.S. Appl. No. 12/567,549, Dec. 8, 2011, pp. 1-13, Alexandria, VA, USA.

* cited by examiner

US 8,261,118 B2

ENERGY-EFFICIENT SERVER LOCATION DETERMINATION

RELATED APPLICATIONS

This application is related to concurrently filed U.S. utility patent application Ser. No. 12/567,549, titled "ENERGY-EFFICIENT SERVER LOCATION DETERMINATION FOR CONFIGURATION CHANGES," which is incorporated herein by reference in its entirety.

BACKGROUND

The present invention relates to data center servers. More particularly, the present invention relates to energy-efficient server location determination.

Data centers house servers for use in computational processing of information. The number of servers at a data center may be based upon the volume of information processing performed by a given data center. Data centers may have one or more rooms for housing the servers. Servers are typically arranged and stacked in racks within rooms of a data center. Racks are typically arranged in rows within the rooms of the data centers with aisles between the rows.

BRIEF SUMMARY

A method includes calculating, via a data center controller, a heat potential value for each of a plurality of available server locations based upon at least one active server in a data center; identifying a minimal calculated heat potential value for the plurality of available server locations; and selecting an available server location associated with the identified minimal calculated heat potential value from the plurality of available server locations.

A system includes a memory and a data center controller configured to: calculate a heat potential value for each of a plurality of available server locations based upon at least one active server in a data center; store the calculated heat potential value for each of the plurality of available server locations within the memory; identify a minimal calculated heat potential value for the plurality of available server locations; and select an available server location associated with the identified minimal calculated heat potential value from the plurality of available server locations.

A computer program product includes: a computer readable storage medium having computer readable program code embodied therewith, the computer readable program code including: computer readable program code configured to calculate a heat potential value for each of a plurality of available server locations based upon at least one active server in a data center; computer readable program code configured to identify a minimal calculated heat potential value for the plurality of available server locations; and computer readable program code configured to select an available server location associated with the identified minimal calculated heat potential value from the plurality of available server locations.

DETAILED DESCRIPTION

Figure 1:
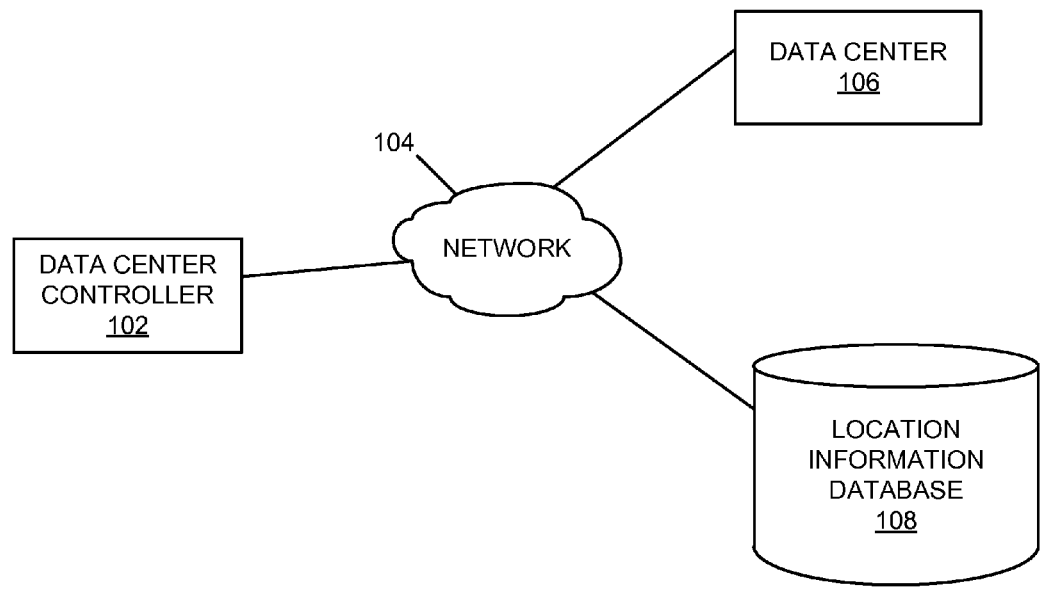
FIG. 1 is a block diagram of an example of an implementation of a system for energy-efficient server location determination according to an embodiment of the present subject matter.

The examples set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The subject matter described herein provides energy-efficient server location determination. As data centers increase (or decrease) in processing demands over time, new servers may be added or turned on (or turned off or removed from service) to account for the changes in data center computational load. Additionally, data centers may be designed and constructed with expansion in mind, with initial placement of servers sufficient to accommodate initial anticipated loads. As such, additional server locations may be available within existing server racks of the data center for the addition of new servers. When a new server is to be introduced to the data center or a server is to be activated to accommodate a change in load (or when a server is to be removed from service or turned off), a location at which to install/activate (or remove/deactivate) a server may be selected from the available server locations. Based upon the energy-efficient server location determination described herein, energy efficiency of the data center may be improved by selecting locations that provide optimal energy efficiency for the data center.

For increases in computational load at a data center, the server location chosen for a new or newly activated server is based upon a minimal calculated heat potential value to provide improved cooling capabilities for the data center by distributing heating from servers throughout the data center. Similarly, for decreases in computational load, the server location chosen for an activated server to turn off or a server to remove from service is based upon a maximal calculated heat potential value to provide improved cooling capabilities for the data center by distributing heating from servers throughout the data center. In this manner, servers are added or activated at locations with minimal heat potential values, and servers are removed or deactivated at locations with maximal heat potential values. As such, energy efficiency of the data center may be improved based upon heat potential for the respective locations within the data center.

To select a server location at which to install or activate a server, a heat potential value is calculated for each available server location within the data center based upon any active servers in the data center. From the calculated set of heat potential values, a minimal calculated heat potential value is identified. The available server location having the identified minimal calculated heat potential value is selected for location of the server.

Similar processing may be performed for removal or deactivation of servers, such as after adding one or more servers with improved performance to remove/replace older servers. Again, a heat potential value is calculated for each available server location within the data center based upon any active servers in the data center. From the calculated set of heat potential values, a maximal calculated heat potential value is identified. The server at the location having the identified maximal calculated heat potential value is selected for removal from the data center.

One of the largest power consumption aspects in a data center is the cooling required for several processors associated with data center servers. Assuming a computation requires K computers to be turned on in the data-center, the location of which K computers have been turned may have a measureable impact on how much cooling is required to maintain the computer operating at maximum power. If computers close to each other are turned on, then more cooling will be needed than if computers far away from each other are turned on. Given a set of several computers that may be turned on or off, and the requirement to turn on a certain number (e.g., K) computers, determining which K computers will require the minimum cooling power when turned on is of interest. As such, the present subject matter describes an approach for determining the set of processors with the minimum required cooling power. A similar problem arises when some slots (e.g., available server locations) out of an existing data center need to be used for placing servers and others are left blank, and when servers are to be removed from service or turned off.

The energy-efficient server location determination described herein may be performed in real time to allow prompt determination of energy-efficient server locations for activating or deactivating servers. For purposes of the present description, real time shall include any time frame of sufficiently short duration as to provide reasonable response time for information processing acceptable to a user of the subject matter described. Additionally, the term "real time" shall include what is commonly termed "near real time"—generally meaning any time frame of sufficiently short duration as to provide reasonable response time for on-demand information processing acceptable to a user of the subject matter described (e.g., within a portion of a second or within a few seconds). These terms, while difficult to precisely define are well understood by those skilled in the art.

FIG. 1 is a block diagram of an example of an implementation of a system 100 for energy-efficient server location determination. Within the system 100, a data center controller 102 communicates via a network 104 with a data center 106, for example, to monitor active status of servers (not shown) within the data center 106, to monitor changes in computational load for the data center 106, and to activate or deactivate servers within the data center 106. The data center controller 102 may be co-located within the data center 106 or may operate remotely from the data center 106. The data center controller 102 also communicates via the network 104 with a location information database 108. As will be described in more detail below, the location information database 108 stores location information for installed servers and for active servers within the data center 106.

As will be described in more detail below in association with FIG. 2 through FIG. 5, the data center controller 102 provides automated energy-efficient server location determination by processing computational load change information and heat potential information for server locations within the data center 106 to determine energy-efficient locations at which to install new servers or activate existing servers, or at which to remove servers or deactivate servers. The automated energy-efficient server location determination is based upon based upon energy-efficiency considerations, such as distance between server locations within the data center 106, obstructions such as racks that change heat transfer between active servers, power consumption (e.g., heating) of active servers within the data center 106, and other related factors.

It should be noted that the data center controller 102 may be a portable computing device, either by a user's ability to move the data center controller 102 to different locations, or by the data center controller 102's association with a portable platform, such as an automobile or other moving vehicle that monitors multiple data centers. It should also be noted that the data center controller 102 may be any computing device capable of processing information as described above and in more detail below. For example, the data center controller 102 may include devices such as a personal computer (e.g., desktop, laptop, palm, etc.) or a handheld device (e.g., cellular telephone, personal digital assistant (PDA), email device, music recording or playback device, etc.), or any other device capable of processing information as described in more detail below.

The network 104 may include any form of interconnection suitable for the intended purpose, including a private or public network such as an intranet or the Internet, respectively, direct inter-module interconnection, dial-up, wireless, or any other interconnection mechanism capable of interconnecting the respective devices.

Figure 2:
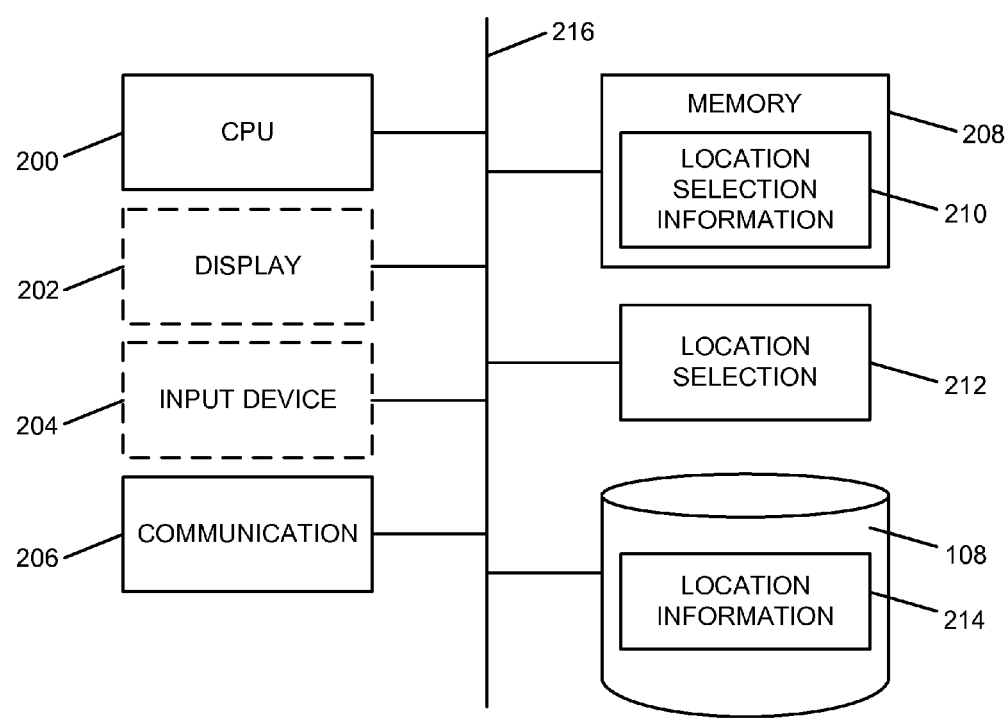
FIG. 2 is a block diagram of an example of an implementation of a data center controller that is capable of performing automated energy-efficient server location determination for a data center according to an embodiment of the present subject matter.

FIG. 2 is a block diagram of an example of an implementation of the data center controller 102 that is capable of performing automated energy-efficient server location determination for a data center, such as the data center 106. A central processing unit (CPU) 200 provides computer instruction execution, computation, and other capabilities within the data center controller 102. A display 202 provides visual information to a user of the data center controller 102 and an input device 204 provides input capabilities for the user.

The display 202 may include any display device, such as a cathode ray tube (CRT), liquid crystal display (LCD), light emitting diode (LED), projection, touchscreen, or other display element or panel. The input device 204 may include a computer keyboard, a keypad, a mouse, a pen, a joystick, or any other type of input device by which the user may interact with and respond to information on the display 202.

It should be noted that the display 202 and the input device 204 are illustrated with a dashed-line representation within FIG. 2 to indicate that they may be optional components for the data center controller 102 for certain implementations. Accordingly, the data center controller 102 may operate as a completely automated embedded device without user configurability or feedback. However, the data center controller 102 may also provide user feedback and configurability via the display 202 and the input device 204, respectively.

A communication module 206 provides interconnection capabilities that allow the data center controller 102 to communicate with other modules within the system 100, such as the data center 106, to activate or deactivate servers within the data center 106. The communication module 206 may include any electrical, protocol, and protocol conversion capabilities useable to provide the interconnection capabilities. Though the communication module 206 is illustrated as a component-level module for ease of illustration and description purposes, it should be noted that the communication module 206 may include any hardware, programmed processor(s), and memory used to carry out the functions of the communication module 206 as described above and in more detail below. For example, the communication module 206 may include additional controller circuitry in the form of application specific integrated circuits (ASICs), processors, antennas, and/or discrete integrated circuits and components for performing communication and electrical control activities associated with the communication module 206. Additionally, the communication module 206 may include interrupt-level, stack-level, and application-level modules as appropriate. Furthermore, the communication module 206 may include any memory components used for storage, execution, and data processing for performing processing activities associated with the communication module 206. The communication module 206 may also form a portion of other circuitry described without departure from the scope of the present subject matter.

A memory 208 includes a location selection information storage area 210 that stores information and calculations, such as heat potential calculations, associated the data center controller 102. As will be described in more detail below, the location selection information stored within the location selection information storage area 210 is used to process load changes for the data center 106, to process heat transfer between active servers, and to select locations within the data center 106 at which to locate/activate or remove/deactivate servers.

It is understood that the memory 208 may include any combination of volatile and non-volatile memory suitable for the intended purpose, distributed or localized as appropriate, and may include other memory segments not illustrated within the present example for ease of illustration purposes. For example, the memory 208 may include a code storage area, a code execution area, and a data area without departure from the scope of the present subject matter.

A location selection module 212 is also illustrated. The location selection module 212 provides energy-based computations for server location selection for the data center controller 102, as described above and in more detail below. The location selection module 212 implements the automated energy-efficient server location determination of the data center controller 102.

Though the location selection module 212 is illustrated as a component-level module for ease of illustration and description purposes, it should be noted that the location selection module 212 may include any hardware, programmed processor(s), and memory used to carry out the functions of this module as described above and in more detail below. For example, the location selection module 212 may include additional controller circuitry in the form of application specific integrated circuits (ASICs), processors, and/or discrete integrated circuits and components for performing communication and electrical control activities associated with the respective devices. Additionally, the location selection module 212 may also include interrupt-level, stack-level, and application-level modules as appropriate. Furthermore, the location selection module 212 may include any memory components used for storage, execution, and data processing for performing processing activities associated with the location selection module 212.

It should also be noted that the location selection module 212 may form a portion of other circuitry described without departure from the scope of the present subject matter. Further, the location selection module 212 may alternatively be implemented as an application stored within the memory 208. In such an implementation, the location selection module 212 may include instructions executed by the CPU 200 for performing the functionality described herein. The CPU 200 may execute these instructions to provide the processing capabilities described above and in more detail below for the data center controller 102. The location selection module 212 may form a portion of an interrupt service routine (ISR), a portion of an operating system, a portion of a browser application, or a portion of a separate application without departure from the scope of the present subject matter.

The location information database 108 is also shown in more detail within FIG. 2. As described above, the location information database 108 provides storage capabilities for information associated with the automated energy-efficient server location determination of the data center controller 102. The location information database 108 includes a location information storage area 214 that may be stored in the form of tables or other arrangements accessible by the data center controller 102. The location information storage area 214 includes storage for distance information representing distances between servers, material properties for partitions and boundaries (e.g., racks) that are located between respective server locations within the data center 106, and power consumption (e.g., heating) of servers within the data center 106. The location information storage area 214 may also include height information representing a height of each respective server within the data center 106 and information associated with any "hot" or "cold" aisles within the data center 106 that may result from placement of servers with either hot or cold sides that face one another within adjacent aisles. Many other factors or aspects of servers and data centers may be considered for determination of energy-efficient server location determination and all are considered within the scope of the present subject matter.

The CPU 200, the display 202, the input device 204, the communication module 206, the memory 208, the location selection module 212, and the location information database 108 are interconnected via an interconnection 216. The interconnection 216 may include a system bus, a network, or any other interconnection capable of providing the respective components with suitable interconnection for the respective purpose. However, with respect to the location information database 108, it is understood that the location information database 108 may alternatively be accessible via the communication module 206 and the network 104, as shown within FIG. 1.

While the data center controller 102 is illustrated with and has certain components described, other modules and components may be associated with the data center controller 102 without departure from the scope of the present subject matter. Additionally, it should be noted that, while the data center controller 102 is described as a single device for ease of illustration purposes, the components within the data center controller 102 may be co-located or distributed and interconnected via a network without departure from the scope of the present subject matter. For a distributed arrangement, the display 202 and the input device 204 may be located at a kiosk or other location, while the CPU 200 and memory 208 may be located at a local or remote server. Many other possible arrangements for components of the data center controller 102 are possible and all are considered within the scope of the present subject matter. It should also be understood that, though the location information storage area 214 is shown within the location information database 108, it may also be stored within the memory 208 without departure from the scope of the present subject matter. Accordingly, the data center controller 102 may take many forms and may be associated with many platforms.

Prior to the description of the processing associated with FIG. 3 through FIG. 5 below, the following description of heat potential calculation is provided. The heat potential value may be calculated in a variety of ways. For example, the heat potential value may be calculated based upon determination of a heat repulsive force generated from each active server. For purposes of the present subject matter, the heat repulsive force may be considered a directional force used to determine impact of heat generated by a server in a given slot on servers located in other slots of racks within the data center 106.

The heat potential for each server location may be calculated, for example, based upon the determined power consumption of each active server divided by the determined distance squared from each active server to each respective available server location (e.g., Power/distance^2). As such, for open air spaces between servers, a linear calculation may be used. A contribution to the heat potential value from each active server may be determined for each respective available server location. The determined contribution to the heat potential value from each active server for each available server location may then be summed to arrive at the calculated heat potential value for any given server location.

Alternatively, when calculating the heat potential for each server location across boundaries, such as rack or wall boundaries and adjacent aisles, construction material characteristics for the racks or walls may be incorporated into the respective heat potential calculation. For example, a piecewise function may be defined for each respective available server location based upon characteristics of each thermal boundary (e.g., rack or wall) or aisle between a heat generating element, such as a server, and the respective available server location. The construction material characteristics for racks or walls may be linear or may be non-linear. In such a situation, the piecewise function may incorporate a set of contribution functions each representing heat potential emanating from each active server over a distance between each respective pair of adjacent rows, beginning from the location of each active server within its respective row and ending at the respective location of each respective available server location within its respective row. Polynomial curve fitting may be used to form the respective contribution functions of the piecewise function or explicit linear or non-linear functions may be used over the respective distance intervals.

As such, for a piecewise function implementation for calculation of heat potential values for each respective server location, a contribution to the heat potential value from each active server may be determined for each respective available server location within each distance interval. The determined contribution to the heat potential value from each active server within each distance interval may then be summed to arrive at the calculated heat potential value for any given server location.

It should be understood that many alternatives exist for calculation of a heat potential value. Accordingly, any such alternative for calculation of a heat potential value is considered within the scope of the present subject matter.

Figure 3:
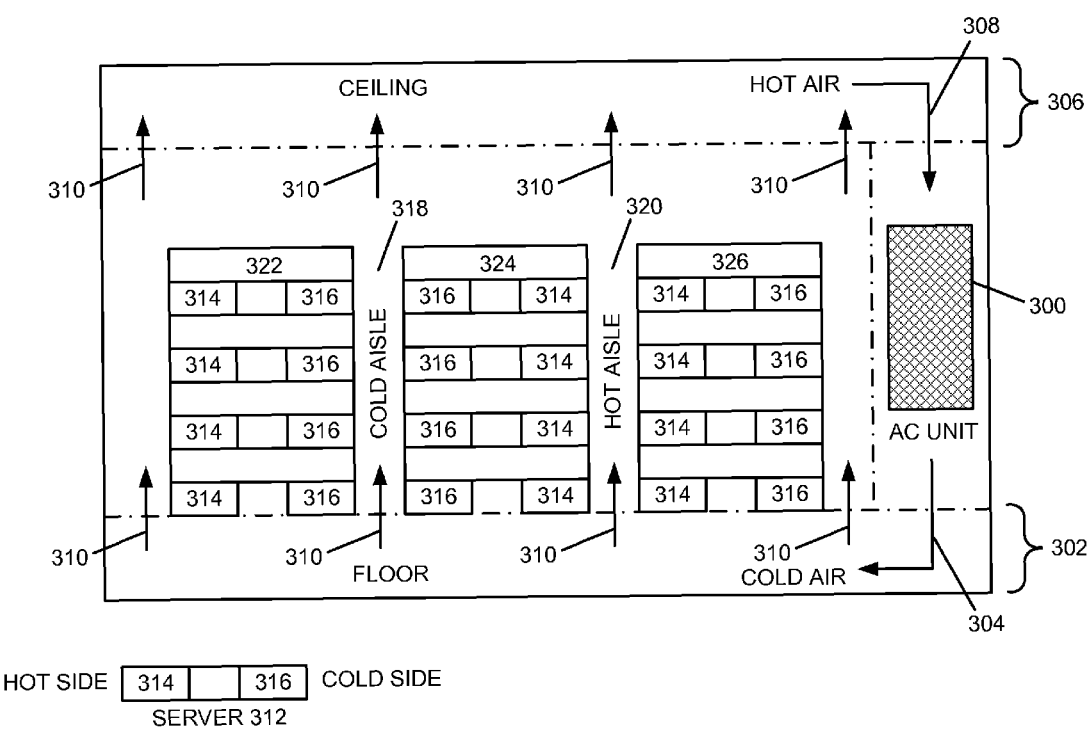
FIG. 3 is a diagram of an example of an implementation of a data center that may be controlled based upon automated energy-efficient server location determination according to an embodiment of the present subject matter.

FIG. 3 is a diagram of an example of an implementation of the data center 106 that may be controlled based upon the automated energy-efficient server location determination described herein. Within the data center 106, an air conditioning (AC) unit 300 is shown. Within the present example, cold air is forced from the AC unit 300 through a floor area 302, as represented by arrow 304, and hot air is returned through a ceiling area 306, as represented by arrow 308. Vertical arrows 310 represent air movement through the data center 106.

Within the present example, it is assumed that each server 312 has a hot side 314 and a cold side 316. Depending upon the arrangement of server 312, orientation of the hot sides 314 and the cold sides 316 may create one or more cold aisles 318 and one or more hot aisles 320 between racks, such as the rack 322, the rack 324, and the rack 326. Many other arrangements of the servers 312 are possible. Further, certain of the servers 312 may be active while certain other of the servers 312 are deactivated, based upon load or whether a server 312 is placed within a given server location. As such, many variations are possible and all are considered within the scope of the present subject matter.

Based upon the variety of arrangements for servers, such as the servers 312, and materials used to construct racks, such as the racks 322 through 324, different equations may be used to calculate heat potential between the various available server locations at which to install or energize (e.g., activate), or uninstall or de-energize (e.g., deactivate) a server. As described in part above, for example, considering free air space between an active server and an available server location, an equation such as an electromagnetic point source equation may be used. In such a situation, the heat potential value may be calculated as the determined power consumption (e.g., heat radiation potential) of each active server divided by the determined distance squared from each active server to the respective available server locations.

Alternatively, when a boundary is crossed, such as one of the racks 322 through 324, the heat potential may change character. For example, the racks 322 through 324 may act as a different type of source and may exhibit some other behavior depending upon the obstructive nature of the respective racks and material properties of construction. Polynomial curve fitting may be used to approximate heat functions to account for variations in such properties.

Once the appropriate function is determined for each distance interval, the heat potential value may be calculated as a piecewise function. A first part of the piecewise function may incorporate a contribution function as a point source equation between a heat-emanating server to the respective rack. A second part of the piecewise function may incorporate a contribution function as the determined equation for propagation of heat from the respective rack to the available server location of interest. All direct contributions as point source functions from active servers through free air space may then be summed with the respective piecewise function results from the various contributions for all piecewise functions to determine the heat potential for the available server location of interest. Many other possibilities exist for calculating a heat potential for each available server location and all are considered within the scope of the present subject matter.

Figure 4:
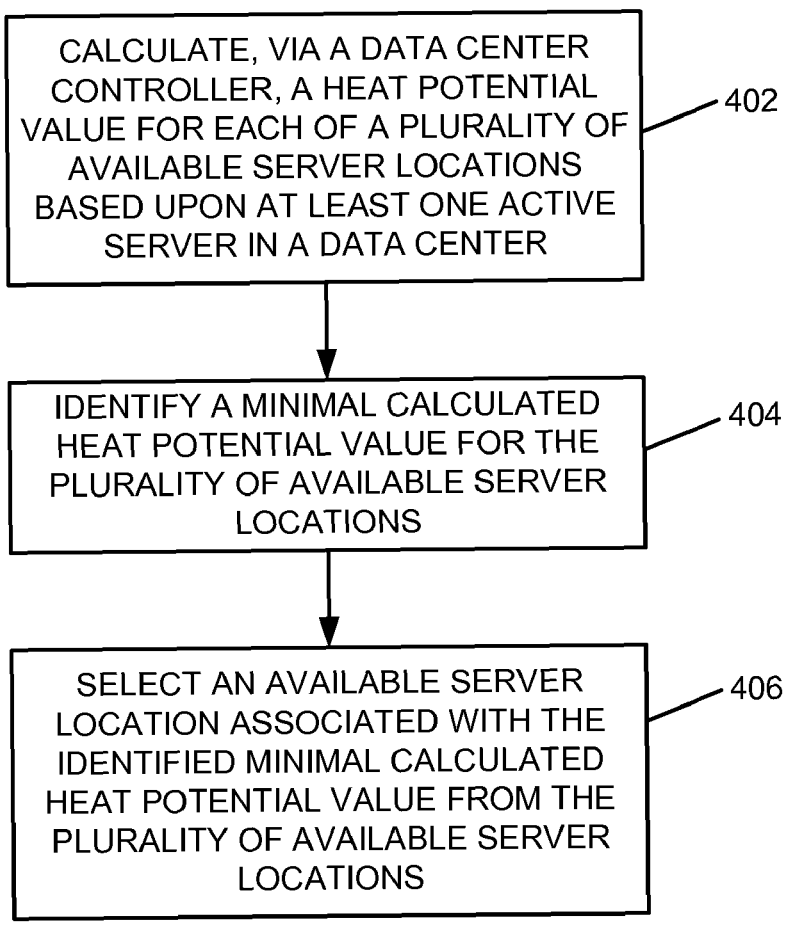
FIG. 4 is a flow chart of an example of an implementation of a process for automated energy-efficient server location determination according to an embodiment of the present subject matter.
Figure 5:
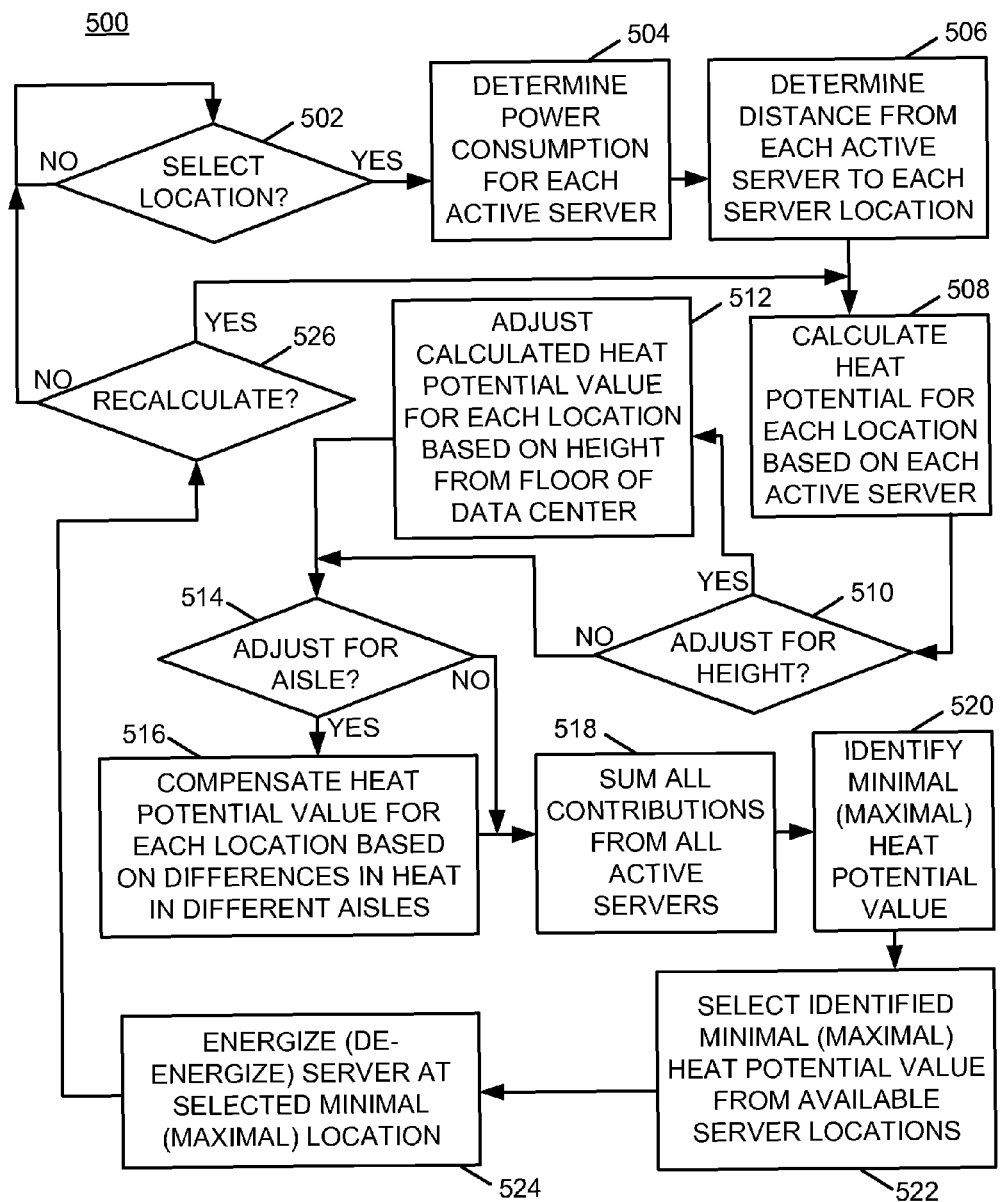
FIG. 5 is a flow chart of an example of an implementation of a process for automated energy-efficient server location determination based upon at least one active server in a data center according to an embodiment of the present subject matter.

FIG. 4 through FIG. 5 below describe example processes that may be executed by devices, such as the data center controller 102, to perform the automated energy-efficient server location determination associated with the present subject matter. Many other variations on the example processes are possible and all are considered within the scope of the present subject matter. The example processes may be performed by modules, such as the location selection module 212 and/or executed by the CPU 200, associated with such devices. It should be noted that time out procedures and other error control procedures are not illustrated within the example processes described below for ease of illustration purposes. However, it is understood that all such procedures are considered to be within the scope of the present subject matter.

FIG. 4 is a flow chart of an example of an implementation of a process 400 for automated energy-efficient server location determination associated with the present subject matter. At block 402, the process 400 calculates, via a data center controller, a heat potential value for each of a plurality of available server locations based upon at least one active server in a data center. At block 404, the process 400 identifies a minimal calculated heat potential value for the plurality of available server locations. At block 406, the process 400 selects an available server location associated with the identified minimal calculated heat potential value from the plurality of available server locations.

FIG. 5 is a flow chart of an example of an implementation of a process 500 for automated energy-efficient server location determination based upon at least one active server in a data center. At decision point 502, the process 500 makes a determination as to whether to select a location at which to change an active state for a server. For example, the process 500 may detect a request via the input device 204 to install or turn on a server, or to remove or turn off a server. Further, the process 500 may automatically sense a change in computational load for a data center, such as the data center 106, and automatically begin processing to select a location at which to change an active state for a server. Additionally, the change in computational load for the data center 106 may be an increase or a decrease in computational load. For an increase in computational load, an available server location having a minimal heat potential value is chosen as the preferred location at which to install or turn on a server. For alternative processing for a decrease in computational load, the available server location having the maximal heat potential value would be a preferred location at which to remove or turn off a server. As such, the process 500 is shown to include a selection of either a minimal or a maximal heat potential value based upon the change in load or, alternatively, whether a server is to be installed or removed, respectively.

When a determination is made at decision point 502 that a request to change an active state for a server has been detected, the process 500 determines power consumption for each active server within the data center 106 at block 504. The process 500 may determine the power consumption for each active server via access to power consumption information stored within the location information database 108 or via any other appropriate mechanism suitable for a given implementation.

At block 506, the process 500 determines a distance from each active server to each respective available server location within the data center 106. At block 508, the process 500 calculates a heat potential value for each available server location based upon each other active server in the data center 106. The heat potential value may be calculated, as described above, or alternatively as appropriate for a given implementation.

At decision point 510, the process 500 makes a determination as to whether to adjust the calculated heat potential values for the respective available server locations based upon a height within a rack (e.g., a height from a floor of the data center 106). When a determination is made to adjust the calculated heat potential values for the respective available server locations based upon a height within a rack, the process 500 adjusts the calculated heat potential value for each of the plurality of available server locations based upon a height from a floor of the data center 106 of each respective available server location at block 512. This adjustment may also be made based upon information stored within the location information database 108 or via any appropriate mathematical calculation.

Upon completion of any adjustment for height at block 512 or upon determining at decision point 510 not to adjust the calculated heat potential values for height, the process 500 makes a determination as to whether to adjust the calculated heat potential values for the respective aisle within which each respective server location resides at decision point 516. For example, as described above, the data center 106 may have servers organized such that hot sides and cold sides of servers face one another in adjacent aisles. As such, aisles within the data center 106 that are associated with the hot sides of servers may be hotter than aisles in the data center 106 associated with the cold sides of servers. In such a situation, an adjustment for the respective aisle characteristics may be appropriate.

When a determination is made at decision point 516 to adjust the calculated heat potential values for the respective aisle within which each respective server location resides, the process 500 compensates the heat potential value for each location based upon the differences in heat in the different aisles. The difference information may also be based upon information stored within the location information database 108 or via any appropriate mathematical calculation. Further, where a piecewise function is used, each contribution function of the piecewise function may be compensated (e.g., by a scalar offset) to account for differences in heat within each of the adjacent aisles of the data center 106. Upon completion of any compensation for heat within the respective aisles of the data center 106 or upon determining not to adjust the calculated heat potential values for the respective aisle within which each respective server location resides, the process 500 sums all of the contributions from all of the active servers at block 518.

The process 500 identifies a minimal (or maximal) heat potential value from the calculated set of heat potential values for the available server locations at block 520. For purposes of the present example, the process 500 may process information for either increases or decreases in computational load for the data center 106. As such, the available server location having the minimal heat potential value is a preferred location at which to install or turn on a server. For alternative processing where a server is to be removed or turned off, the available server location having the maximal heat potential value would be a preferred location at which to remove or turn off a server. As such, the process 500 is shown to include a selection of either a minimal or a maximal heat potential value based upon the change in load.

At block 522, the process 500 selects an available server location associated with the identified minimal (or maximal) calculated heat potential value from the plurality of available server locations as the location at which to install or turn on a server at block 522. At block 524, the process 500 energizes (or de-energizes) the server at the respective identified minimal (or maximal) heat potential value of the available server locations. It is understood that the present subject matter may also be implemented by printing an output of the identified location for installation or removal of a server.

At decision point 526, the process 500 makes a determination as to whether to recalculate heat potential values. This determination may be based upon an additional change in computational load or another indication as appropriate for a given implementation. When a determination is made to recalculate the heat potential values, the process 500 returns to block 508 and iterates as described above. When a determination is made not to recalculate the heat potential values, the process 500 returns to decision point 502 to await a request to select a location for a change in active status of a server.

As described above in association with FIG. 1 through FIG. 5, the example systems and processes provide automated energy-efficient server location determination. Many other variations and additional activities associated with energy-efficient server location determination are possible and all are considered within the scope of the present subject matter.

Those skilled in the art will recognize, upon consideration of the above teachings, that certain of the above examples are based upon use of a programmed processor, such as the CPU 200. However, the invention is not limited to such example embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable storage medium that can direct a computer or other programmable data processing apparatus to function in a particular manner, such that the instructions stored in the computer-readable storage medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    calculating, via a data center controller, a heat potential value for each of a plurality of available server locations based upon at least one active server in a data center, comprising:
        determining a power consumption of the at least one active server in the data center;
        determining a distance from the at least one active server to each respective one of the plurality of available server locations; and
        calculating, for each respective one of the plurality of available server locations, the heat potential value as the determined power consumption of each of the at least one active server divided by the determined distance squared from each of the at least one active server to the respective one of the plurality of available server locations;
    identifying a minimal calculated heat potential value for the plurality of available server locations; and
    selecting an available server location associated with the identified minimal calculated heat potential value from the plurality of available server locations.

2. The method of claim 1, wherein the data center comprises a plurality of rows of server racks and the at least one active server is located within a first row of the plurality of rows and wherein a second row of the plurality of rows has at least one adjacent row between the second row and the first row, and further comprising:
    defining, for each respective one of the plurality of available server locations located within the second row, a piecewise function, wherein the piecewise function comprises a plurality of contribution functions each representing heat potential emanating from the at least one active server over a distance between each respective pair of adjacent rows, beginning from the location of the at least one active server within the first row and ending at the respective location of each respective one of the plurality of available server locations within the second row; and
    wherein calculating, via the data center controller, the heat potential value for each of the plurality of available server locations based upon the at least one active server in the data center comprises calculating the heat potential value for each respective one of the plurality of available server locations based upon the defined piecewise function.

3. The method of claim 2, wherein each server located within the data center comprises a hot side and a cold side, and the data center is arranged so that, for adjacent aisles, either the hot sides of each server located in the adjacent aisles face each other or the cold sides of each server located in adjacent aisles face each other, resulting in aisles within the data center associated with the hot sides of servers that are hotter than aisles in the data center associated with the cold sides of servers, and further comprising compensating each of the plurality of contribution functions of the piecewise function to account for differences in heat within each of the adjacent aisles.

4. The method of claim 1, further comprising automatically energizing a server located at the selected available server location associated with the identified minimal calculated heat potential value.

5. The method of claim 1, further comprising:
    identifying a maximal calculated heat potential value for the plurality of available server locations;
    selecting an available server location associated with the identified maximal calculated heat potential value from the plurality of available server locations; and
    automatically de-energizing a server located at the selected available server location associated with the identified maximal calculated heat potential value.

6. The method of claim 1, wherein the at least one active server comprises a plurality of active servers and wherein calculating, via a data center controller, the heat potential value for each of the plurality of available server locations based upon the at least one active server in the data center comprises:
    determining, for each respective one of the plurality of available server locations, a contribution to the heat potential value from each of the plurality of active servers; and
    summing the respective determined contribution to the heat potential value from each of the plurality of active servers.

7. A system, comprising:
a memory; and
a data center controller configured to:
    calculate a heat potential value for each of a plurality of available server locations based upon at least one active server in a data center, where the data center controller is configured to:

determine a power consumption of the at least one active server in the data center;

determine a distance from the at least one active server to each respective one of the plurality of available server locations; and calculate, for each respective one of the plurality of available server locations, the heat potential value as the determined power consumption of each of the at least one active server divided by the determined distance squared from each of the at least one active server to the respective one of the plurality of available server locations;

store the calculated heat potential value for each of the plurality of available server locations within the memory;

identify a minimal calculated heat potential value for the plurality of available server locations; and select an available server location associated with the identified minimal calculated heat potential value from the plurality of available server locations.

8. The system of claim 7, wherein the data center comprises a plurality of rows of server racks and the at least one active server is located within a first row of the plurality of rows and wherein a second row of the plurality of rows has at least one adjacent row between the second row and the first row, and wherein the data center controller is further configured to:

define, for each respective one of the plurality of available server locations located within the second row, a piecewise function, wherein the piecewise function comprises a plurality of contribution functions each representing heat potential emanating from the at least one active server over a distance between each respective pair of adjacent rows, beginning from the location of the at least one active server within the first row and ending at the respective location of each respective one of the plurality of available server locations within the second row; and wherein, in being configured to calculate the heat potential value for each of the plurality of available server locations based upon the at least one active server in the data center, the data center controller is configured to calculate the heat potential value for each respective one of the plurality of available server locations based upon the defined piecewise function.

9. The system of claim 7, wherein the data center controller is configured to automatically energize a server located at the selected available server location associated with the identified minimal calculated heat potential value.

10. The system of claim 7, wherein the data center controller is further configured to:

identify a maximal calculated heat potential value for the plurality of available server locations;

select an available server location associated with the identified maximal calculated heat potential value from the plurality of available server locations; and automatically de-energize a server located at the selected available server location associated with the identified maximal calculated heat potential value.

11. The system of claim 7, wherein the at least one active server comprises a plurality of active servers and wherein, in being configured to calculate the heat potential value for each of the plurality of available server locations based upon the at least one active server in the data center, the data center controller is configured to:

determine, for each respective one of the plurality of available server locations, a contribution to the heat potential value from each of the plurality of active servers; and sum the respective determined contribution to the heat potential value from each of the plurality of active servers.

12. A computer program product comprising:

a computer readable storage medium having computer readable program code embodied therewith, the computer readable program code comprising:

computer readable program code configured to calculate a heat potential value for each of a plurality of available server locations based upon at least one active server in a data center comprising:

computer readable program code configured to determine a power consumption of the at least one active server in the data center;

computer readable program code configured to determine a distance from the at least one active server to each respective one of the plurality of available server locations; and computer readable program code configured to calculate, for each respective one of the plurality of available server locations, the heat potential value as the determined power consumption of each of the at least one active server divided by the determined distance squared from each of the at least one active server to the respective one of the plurality of available server locations;

computer readable program code configured to identify a minimal calculated heat potential value for the plurality of available server locations; and computer readable program code configured to select an available server location associated with the identified minimal calculated heat potential value from the plurality of available server locations.

13. The computer program product of claim 12, wherein the data center comprises a plurality of rows of server racks and the at least one active server is located within a first row of the plurality of rows and wherein a second row of the plurality of rows has at least one adjacent row between the second row and the first row, and further comprising:

computer readable program code configured to define, for each respective one of the plurality of available server locations located within the second row, a piecewise function, wherein the piecewise function comprises a plurality of contribution functions each representing heat potential emanating from the at least one active server over a distance between each respective pair of adjacent rows, beginning from the location of the at least one active server within the first row and ending at the respective location of each respective one of the plurality of available server locations within the second row; and wherein the computer readable program code configured to calculate the heat potential value for each of the plurality of available server locations based upon the at least one active server in the data center comprises computer readable program code configured to calculate the heat potential value for each respective one of the plurality of available server locations based upon the defined piecewise function.

14. The computer program product of claim 13, wherein each server located within the data center comprises a hot side and a cold side, and the data center is arranged so that, for adjacent aisles, either the hot sides of each server located in the adjacent aisles face each other or the cold sides of each server located in adjacent aisles face each other, resulting in aisles within the data center associated with the hot sides of servers that are hotter than aisles in the data center associated with the cold sides of servers, and further comprising computer readable program code configured to compensate each of the plurality of contribution functions of the piecewise function to account for differences in heat within each of the adjacent aisles.

15. The computer program product of claim 12, further comprising computer readable program code configured to automatically energize a server located at the selected available server location associated with the identified minimal calculated heat potential value.

16. The computer program product of claim 12, further comprising:
   computer readable program code configured to identify a maximal calculated heat potential value for the plurality of available server locations;
   computer readable program code configured to select an available server location associated with the identified maximal calculated heat potential value from the plurality of available server locations; and
   computer readable program code configured to automatically de-energize a server located at the selected available server location associated with the identified maximal calculated heat potential value.

17. The computer program product of claim 12, wherein the at least one active server comprises a plurality of active servers and wherein the computer readable program code configured to calculate the heat potential value for each of the plurality of available server locations based upon the at least one active server in the data center comprises:
   computer readable program code configured to determine, for each respective one of the plurality of available server locations, a contribution to the heat potential value from each of the plurality of active servers; and
   computer readable program code configured to sum the respective determined contribution to the heat potential value from each of the plurality of active servers.

* * * * *